(12) United States Patent
Liu

(10) Patent No.: US 7,154,548 B2
(45) Date of Patent: Dec. 26, 2006

(54) MULTIPLEXED AND PIPELINED COLUMN BUFFER FOR USE WITH AN ARRAY OF PHOTO SENSORS

(75) Inventor: Tina Y Liu, Tarzana, CA (US)

(73) Assignee: Valley Oak Semiconductor, Westlake Village, CA (US)

( * ) Notice: Subject to any disclaimer, the term of this patent is extended or adjusted under 35 U.S.C. 154(b) by 878 days.

(21) Appl. No.: 09/772,267

(22) Filed: Jan. 29, 2001

(65) Prior Publication Data
US 2002/0100862 A1   Aug. 1, 2002

(51) Int. Cl.
*H04N 3/14* (2006.01)
*H04N 5/335* (2006.01)

(52) U.S. Cl. .................... 348/302; 250/208.1

(58) Field of Classification Search ........ 348/304–308, 348/312, 315, 316, 317, 241; 250/208.1
See application file for complete search history.

(56) References Cited

U.S. PATENT DOCUMENTS

| | | | | | |
|---|---|---|---|---|---|
| 4,996,413 | A | * | 2/1991 | McDaniel et al. ....... | 250/208.1 |
| 5,965,871 | A | * | 10/1999 | Zhou et al. ............... | 250/208.1 |
| 6,067,113 | A | * | 5/2000 | Hurwitz et al. ............. | 348/241 |
| 6,118,115 | A | * | 9/2000 | Kozuka et al. .......... | 250/208.1 |
| 6,366,320 | B1 | * | 4/2002 | Nair et al. .................. | 348/300 |
| 6,377,304 | B1 | * | 4/2002 | Saitoh ........................ | 348/308 |
| 6,677,997 | B1 | * | 1/2004 | Kuroda et al. ............. | 348/308 |
| 6,747,695 | B1 | * | 6/2004 | Afghahi ...................... | 348/241 |
| 6,747,699 | B1 | * | 6/2004 | Ohzu et al. ................. | 348/294 |
| 6,784,932 | B1 | * | 8/2004 | Okamoto .................... | 348/302 |
| 6,801,256 | B1 | * | 10/2004 | Tanaka et al. .............. | 348/294 |
| 6,831,685 | B1 | * | 12/2004 | Ueno et al. ................. | 348/243 |
| 7,068,312 | B1 | * | 6/2006 | Kakumoto et al. ......... | 348/241 |
| 2001/0012070 | A1 | * | 8/2001 | Enod et al. ................. | 348/302 |

* cited by examiner

Primary Examiner—Vivek Srivastava
Assistant Examiner—Yogesh Aggarwal
(74) Attorney, Agent, or Firm—Allan Jacobson

(57) ABSTRACT

An electronic imaging chip containing an array of photodiodes includes a multiplexed column buffer. The multiplexed column buffer serves a plurality of columns in the photodiode array. By multiplexing active amplifier elements, such as the differential gain amplifiers and the bus driver amplifiers, a wider area than one column width is available on the semiconductor chip for layout of the column buffer. In the disclosed embodiment, 4 columns share a common multiplexed column buffer. The area available for layout of the multiplexed column buffer is 4 times as wide as compared to that for a non-multiplexed column buffer.

2 Claims, 6 Drawing Sheets

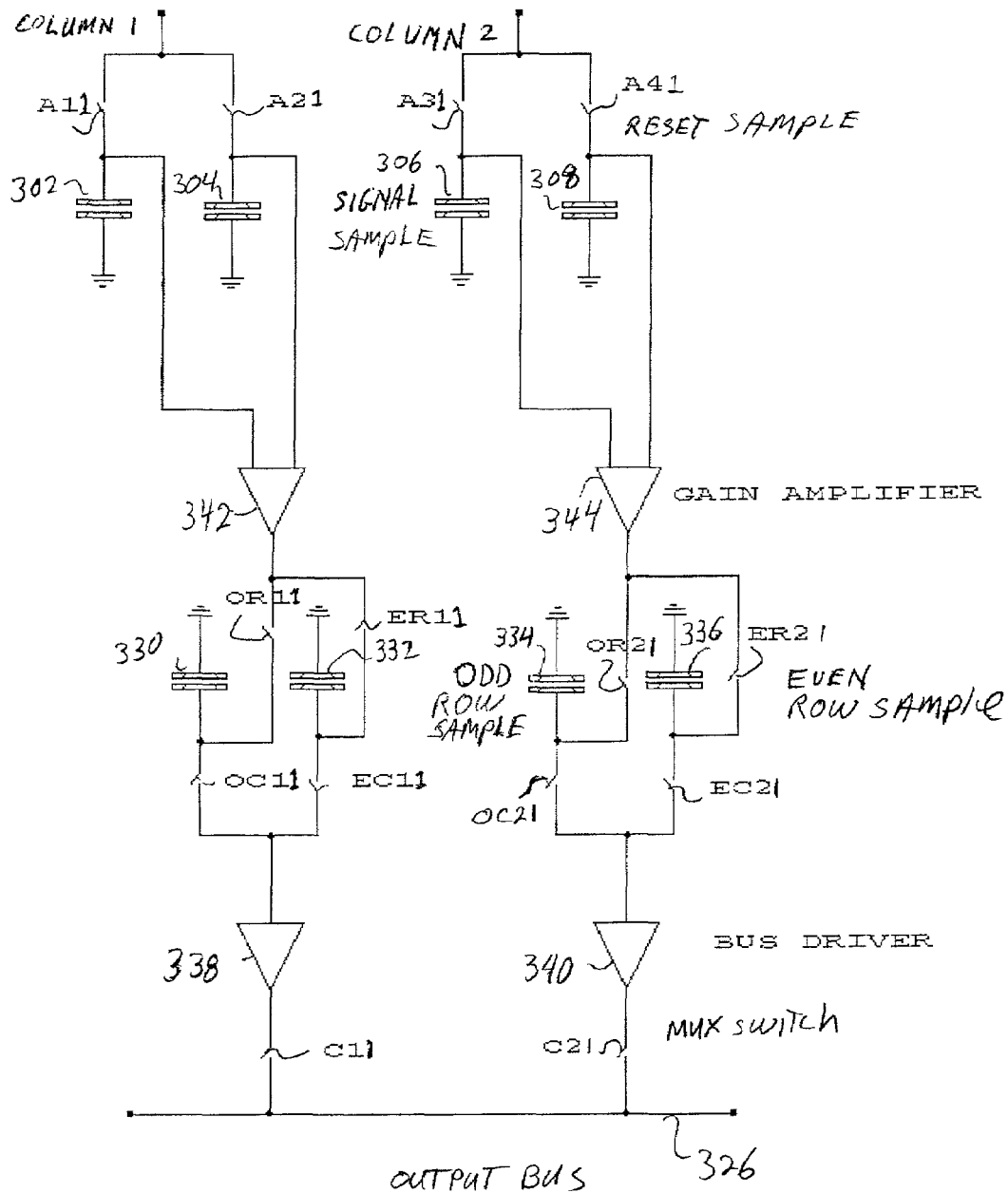

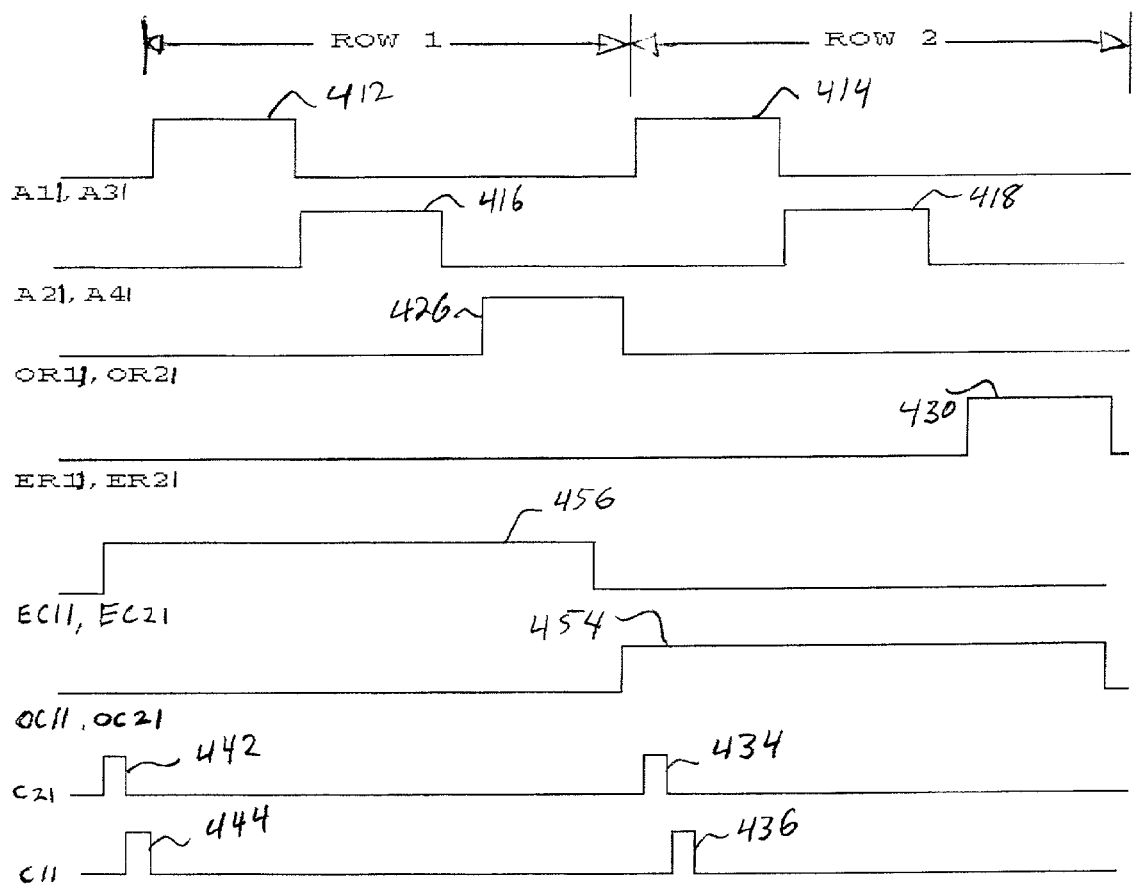
FIGURE 4: TIMING DIAGRAM FOR PIPELINED COLUMN BUFFER
PRIOR ART

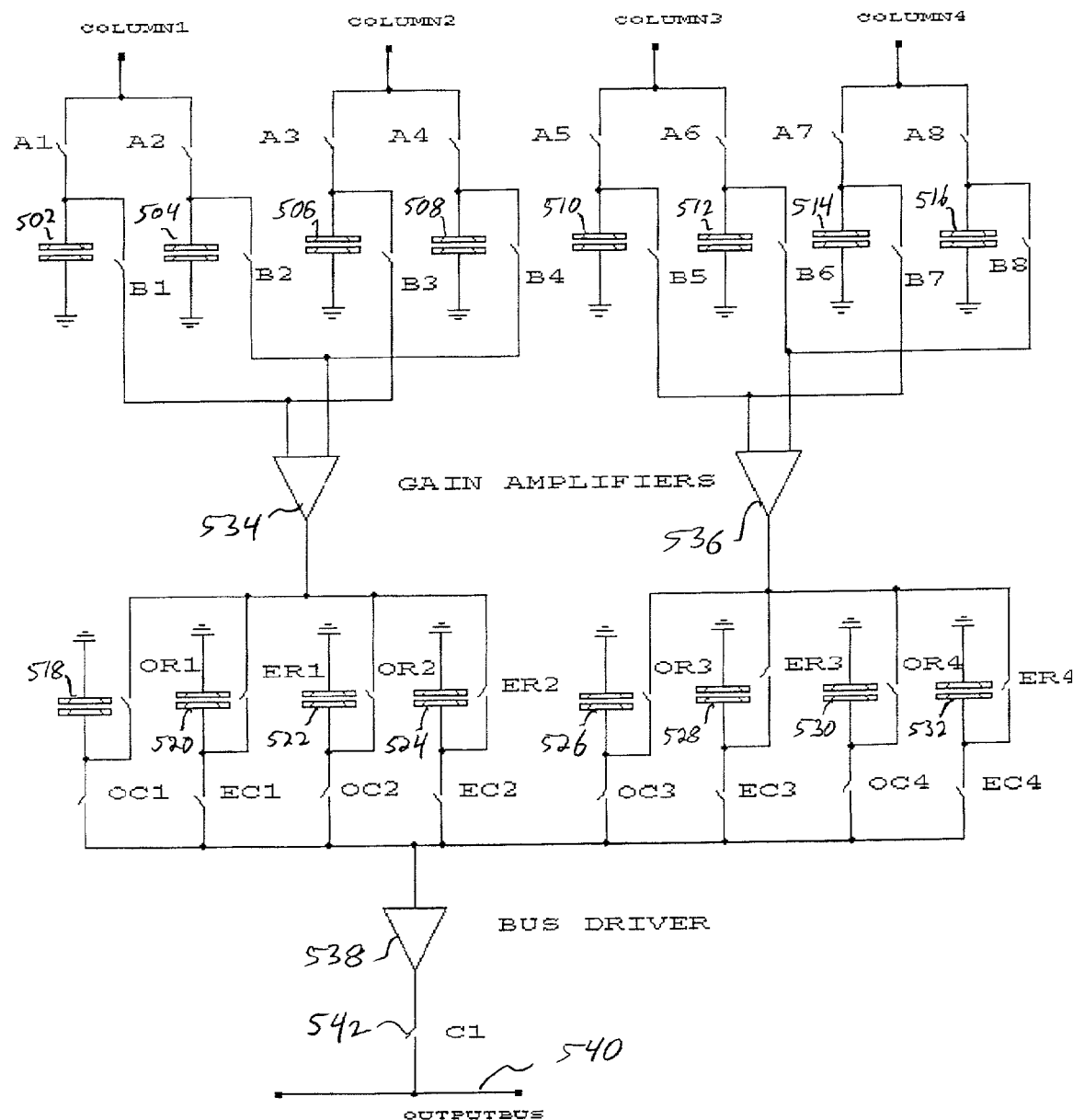
FIGURE 5: MULTIPLEXED, PIPELINED COLUMN BUFFERS.

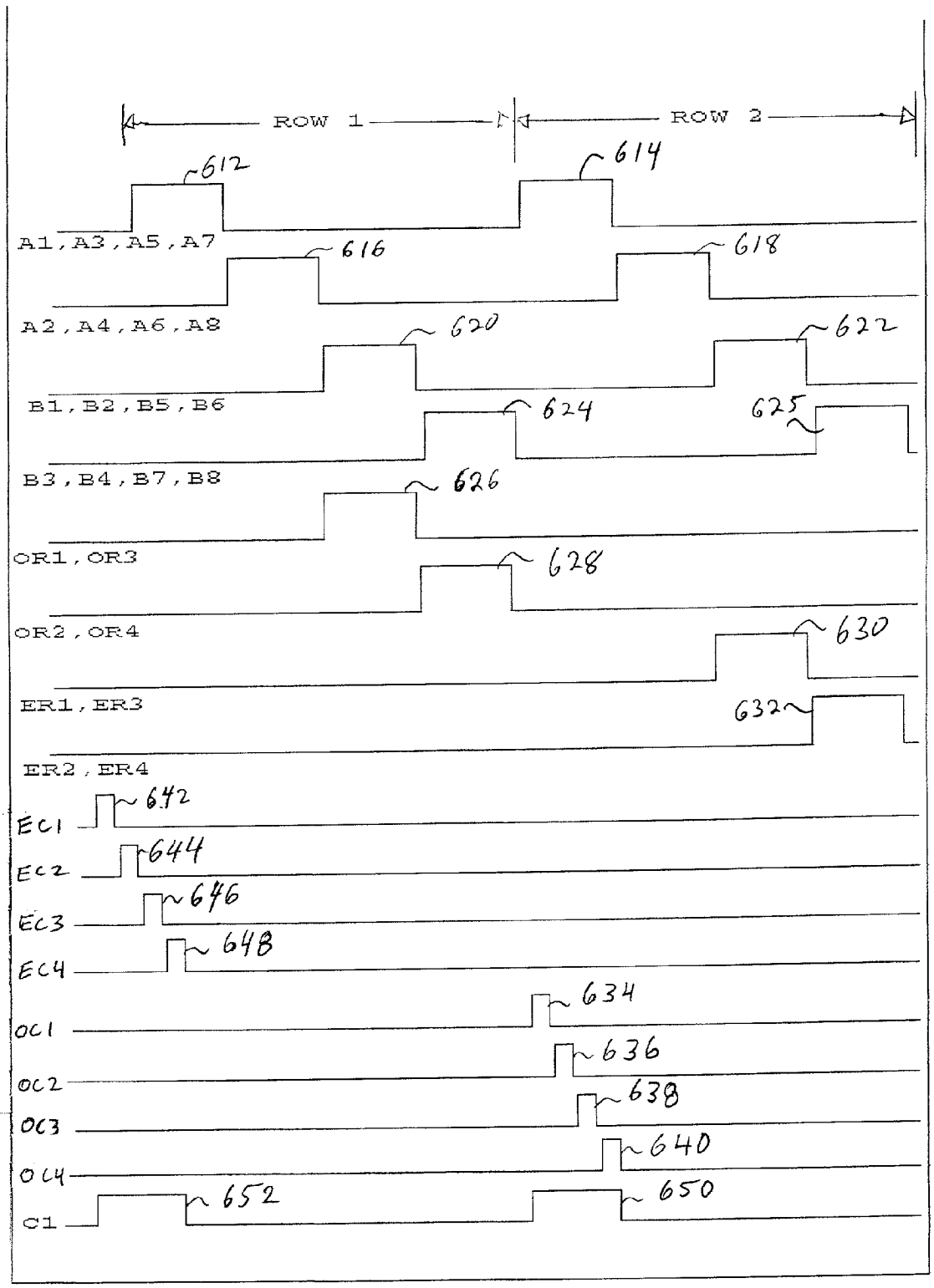

MULTIPLEXED AND PIPELINED COLUMN BUFFER FOR USE WITH AN ARRAY OF PHOTO SENSORS

FIELD OF INVENTION

The present invention relates to a semiconductor chip for forming an electronic image in a digital camera. More specifically, the present invention relates to a multiplexed column buffer for use with an array of photo sensors.

BACKGROUND OF THE INVENTION

A semiconductor imaging chip is an integrated circuit containing a two dimensional array of photosensitive diodes and amplifiers known as "active pixel sensors" (APS). A "pixel" is a single picture element, such as one dot of a given color. The imaging chip is placed in the focal plane of a digital camera and exposed to an image during the camera shutter time interval. Diodes in the silicon substrate detect the light, and generate electrons, which accumulate negative charge on n-type junctions in the semiconductor circuit substrate.

Initially, each photodiode is reset to an initial positive voltage. A focused image is projected onto the surface of the chip. Incident light discharges the initial positive voltage on each photodiode by an amount proportional to the total light flux. The time between reset and readout is the image exposure time or shutter time interval. A mechanical shutter is simulated by resetting a given photodiode, and then reading out the voltage on the photodiode a short time later.

The photodiode array is arranged in rows and columns. The resulting voltage on each of the photodiodes is read out by means of scanning and signal processing circuits, which are typically included on the imaging chip. Individual APS cells are addressed by accessing each row of the APS cell array individually and sensing the respective outputs of the corresponding APS cells in the selected row on the plurality of columns in the array. A column buffer is provided for each column.

Pattern Noise in the APS Cell Array

Each APS cell contains a photodiode and a small amplifier formed by field effect transistors (FET) operated as a source follower (a current amplifier) circuit. A suitable active pixel sensor containing a photodiode and four transistors forming a source follower amplifier circuit is disclosed in U.S. Pat. No. 4,445,117 to Gaalema et al. The disclosed APS cell includes a first control line to access the photodiode during readout, and a second separate control line to reset the photodiode after readout in preparation for the next image exposure. An improved APS cell layout with merged access and control lines is disclosed in U.S. Pat. No. 5,083,016 to Wyles et al.

Pattern noise results from the small differences between individual FET transistors in each APS cell. In particular, each source follower buffer in each APS cell will have a (different) offset voltage between the photodiode voltage and the output column bus voltage, which offset voltage is equal to about one gate-to-source threshold of the FET source follower transistor. Since there are random variations of the offset voltage between individual FET transistors on the order of some tens of millivolts, the random offset voltages produce a fixed pattern of noise arising from the imaging chip itself, which pattern noise will be superimposed on the imaged illumination. The pattern noise caused by the variation in APS offset voltage is unacceptably large for most applications, and particularly in the case of low power cmos semiconductor fabrication.

Pattern Noise Cancellation

Pattern noise is cancelled in the column buffers that readout the image data stored in the APS cells. To cancel pattern noise the APS pixel signal value is readout and sampled. The APS cell is reset and the APS reset signal value is sampled. The difference between the sampled (stored) APS pixel signal value and the measured offset voltage in the reset condition (the stored APS reset signal value) is proportional to the true pixel (photodiode) illumination. By taking the difference between the previously stored sampled APS pixel signal value and the current APS reset signal value, an output pixel signal value is produced in which the source follower buffer offsets are cancelled. In other words, by subtracting the reset signal value of the current APS cell from the pixel signal value of the current APS cell, the pattern noise due to the source follower offset is cancelled.

Column Buffer Layout on a Semiconductor Chip

In a semiconductor chip, circuits are constructed at or near the surface of a silicon wafer. A column buffer circuit contains memory elements and amplifiers. A first memory element stores the current APS pixel signal value and a second memory element stores the current APS reset signal value. A first (differential gain) amplifier is responsive to the stored current APS pixel signal and stored APS reset signal values to subtract one stored signal from the other and provide a corrected APS pixel signal value output. Corrected APS pixel signal value outputs are further stored in odd and even row memory elements. A second (bus driver) amplifier is provided, responsive to the stored corrected APS pixel signal values stored in the odd and even row memory elements, in order to drive the output bus from the photodiode array.

A semiconductor imaging chip needs many photodiodes in order to provide suitably detailed images. To increase the photographic detail (i.e., obtain more resolution by having more pixels), the number of photodiodes in the array is typically increased, which increases the number of columns. However, increasing the number of photodiodes in the same size array results in more closely spaced columns, leaving less room for each column buffer. As a result, each column buffer in a larger photodiode array must be laid out in an area resembling a very long and narrow corridor. The awkward area available results in inefficient layout and ultimately limits the maximum potential size of the imaging array.

SUMMARY OF THE INVENTION

The present invention is embodied in a column buffer in which the differential gain amplifier and/or bus driver amplifier is shared by multiplexing the differential gain and/or bus driver amplifiers among a plurality of columns of the photodiode array. In particular, each differential gain amplifier in each multiplexed column buffer is shared among a first plurality of columns. In addition, each bus amplifier is shared among a second plurality of columns. By multiplexing column buffers among a plurality of columns, the multiplexed column buffer may be laid out in a wider area. For example, if a column buffer is multiplexed among 4 columns, then the available space to layout the column buffer is 4 times as wide as compared to a column buffer dedicated to a single column.

BRIEF DESCRIPTION OF THE DRAWINGS

FIG. 3 is a schematic diagram of a column buffer in accordance with the prior art.

FIG. 4 is a timing diagram of control signals for a column buffer in accordance with the prior art.

FIG. 5 is a schematic diagram of a multiplexed and pipelined column buffer in accordance with the present invention FIG. 6 is a timing diagram of control signals for a multiplexed and pipelined column buffer in accordance with the present invention.

DETAILED DESCRIPTION

Figure 1:
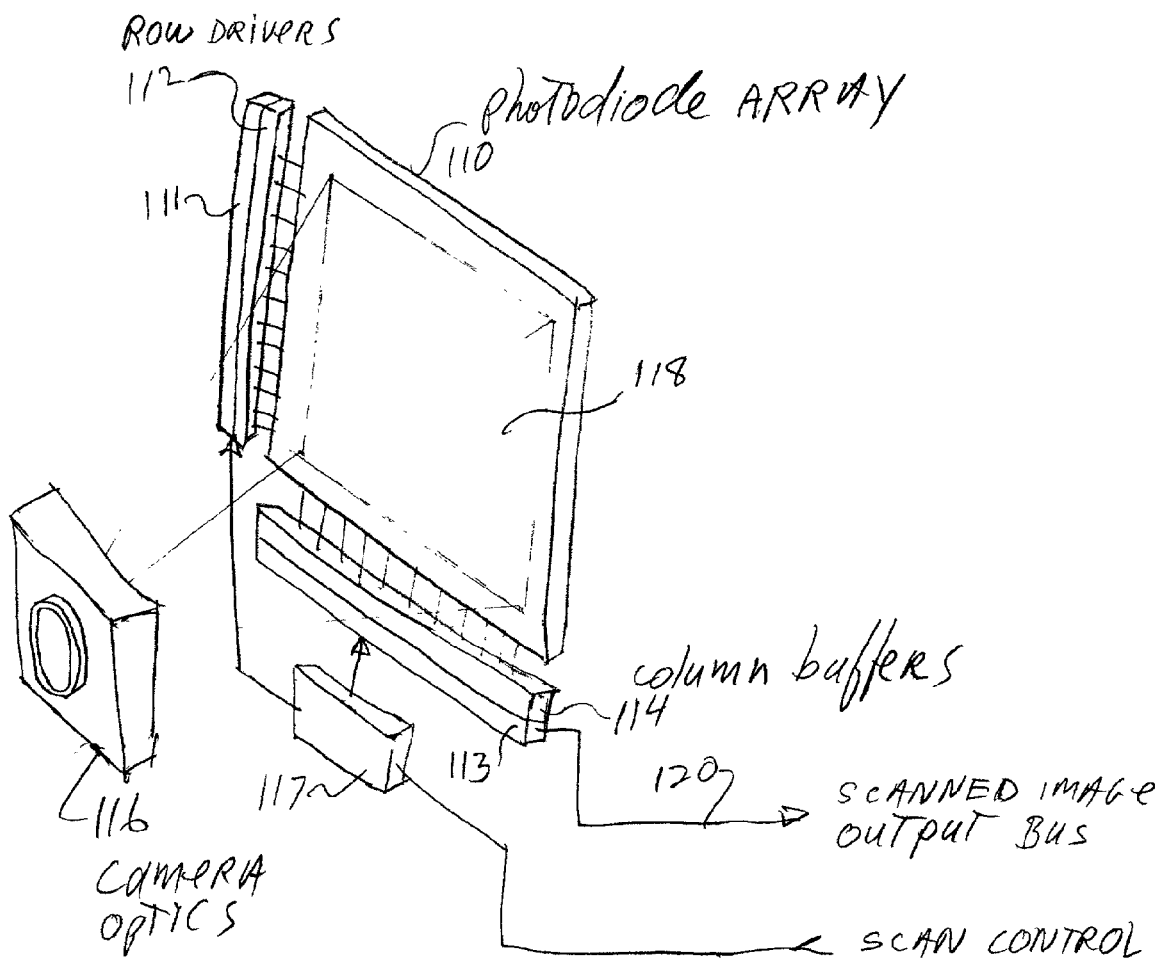
FIG. 1 is an isometric drawing of photodiode array for use in a digital camera in accordance with the present invention.

A digital camera incorporating a photodiode array 110 of active pixel sensors (APS cells) is shown in FIG. 1. The photodiode array 110 includes an image area composed of APS cells onto which the camera optics 116 projects a focused image 118. Each APS cell contains a photodiode and an active source follower amplifier. The photodiode array 110 is addressed row by row via a plurality of row drivers 112. Each of the row drivers 112 is driven by a respective storage element of the vertical shift register 111. The stored pixels in each row are sensed by a plurality of column buffers 114. After the pixel values from the column buffers are stable, the row of pixel values is loaded into a shift register 113 for readout 120. In the alternative, the rows and columns of the array 110 may be accessed and sensed, respectively, by using independent address decoders in lieu of shift registers.

In operation with a mechanical or electromechanical shutter, the camera optics 116 opens a shutter and exposes the photodiode array 110 to an image. After the shutter closes, row drivers 112 responsive to shift register 111 under the control of control logic 117, scan the photodiode array 110 row by row. As each row is accessed, column buffers 114 capture the pixel data incident on the photodiode array 110, which pixel data is then loaded into the shift register 113, and read out serially on a scanned image output bus 120. For a simple scan, the shift register 111 is reset, and a single binary 1 is loaded by the scan control 117. Thereafter, the single binary 1 is shifted through the register 111, activating one row driver at a time until all the rows of the array 110 have been scanned.

In the alternative, the camera optics 116 continuously exposes the photodiode array 110 to an image. Row drivers 112 under the control of control logic 117 and shift register 111 reset the photodiode array 110 row by row. Then, after a fixed time interval following each such row reset, row drivers responsive to the shift register contents, scan the same row in the photodiode array 110. As each row is reset and then accessed one image exposure time interval after being reset, column buffers 114 capture the pixel data incident on the photodiode array 110. The pixel data is then read out serially on a scanned image output bus 120. For such scan pattern, the shift register 111 is reset, and a binary pattern is loaded into the shift register 111 by the scan control 117. Thereafter, the binary pattern is shifted through the register 111, activating appropriate the row driver or row drivers at one time until all the rows of the array 110 have been scanned.

Figure 2A:
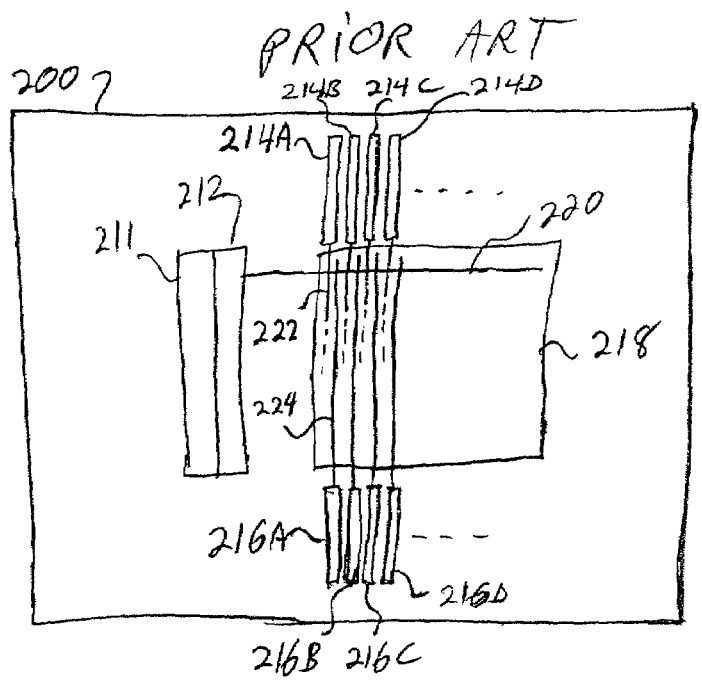
FIG. 2A is a layout drawing in block diagram form of a photodiode array on a semiconductor integrated circuit in accordance with the prior art.

The typical layout of a prior art semiconductor imaging chip is illustrated in FIG. 2A. The photodiode array 218 contains a plurality of rows 220 and columns 222, 224. A photodiode is located at each intersection of the rows and columns (e.g., where row 220 intersects column 222). Row drivers 212, controlled by shift register 111 (or in the alternative, an address decoder), select one of the rows 220 in the array 218. Column buffers are provided to sense the APS pixel signal values stored on the selected row 220. In particular, a first plurality of column buffers 216A, 216B, 216C, and 216D on one side of the array 218 readout data from even numbered columns. A second plurality of column buffers 214A, 214B, 214C, and 214D on the other side of the array 218 readout data from odd numbered columns. By locating column buffers 214A–214D, 216A–216D on either side of the photodiode array 218, each column buffer may be laid out in an area twice as wide as compared to the case in which column buffers were located on one side only of the array 218. In particular, for 3.3 micron minimum spacing of the columns 222, 224 in the array 218, the width available for each column buffer 214A–214D, 216A–216D is 6.6 microns wide.

Figure 2B:
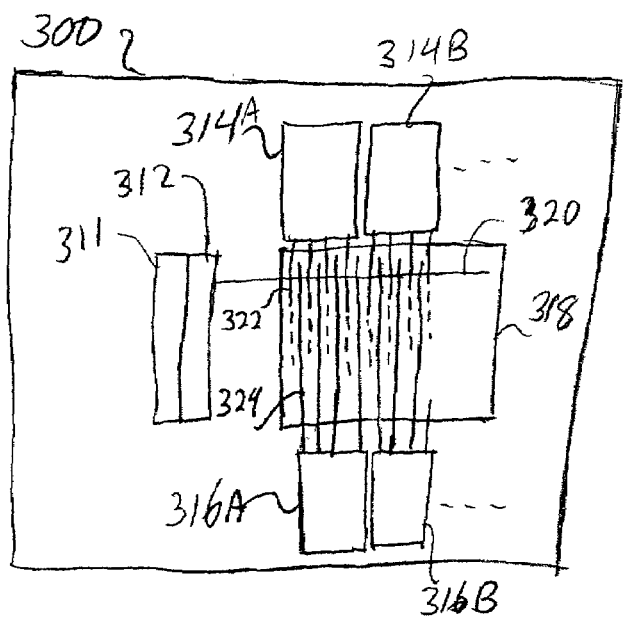
FIG. 2B is a layout drawing of a photodiode array in block diagram form on a semiconductor integrated circuit in accordance with the present invention.

The typical layout of a semiconductor imaging chip in accordance with the present invention is illustrated in FIG. 2B. The photodiode array 318 contains a plurality of rows 320 and columns 322, 324. As before, photodiodes are located at each row and column intersection, and row drivers 312, controlled by shift register 311 (or in the alternative, an address decoder), select one of the rows 320 in the array 318. Multiplexed column buffers 314A, 314B, 316A and 316B are provided to sense the pixel values stored on the selected row 320. In particular, a first plurality of column buffers 316A, 316B, on one side of the array 318 readout data from even numbered columns. A second plurality of column buffers 314A, 314B on the other side of the array 318 readout data from odd numbered columns. As before, by locating column buffers 314A, 314B, 316A 316B on either side of the photodiode array 318, each column buffer may be laid out in an area twice as wide as compared to the case in which column buffers were located on one side only of the array 318.

However by multiplexing each column buffer 314A, 314B, 316A, 316B among 4 columns, each column buffer 314A, 314B, 316A, 316B may be laid out in an area 4 times as wide as compared to the case in which column buffers are dedicated to a single column and not multiplexed. In particular, for 3.3 micron minimum spacing of the columns 322, 324 in the array 318, the width available for each column buffer 314A, 314B, 316A, 316B is 26.4 microns wide.

A pair of prior art column buffers is shown in the schematic circuit diagram of FIG. 3. Each column buffer consists of a first memory element 302, 306 for storing an APS pixel signal value and a second memory element 304, 308 for storing an APS reset signal value. Switches A11, A31 and A21, A41 couple respective APS pixel signal values and APS reset signal values to respective memory elements of 302, 306 and 304, 308. Each column buffer further includes a differential gain amplifier 342, 344 for taking the difference between the stored APS pixel signal value and the stored APS reset signal value on memory elements 302, 306 and 304, 308 to provide a corrected APS pixel signal value.

Each column buffer further includes third memory element 330, 334 and a fourth memory element 332, 336 for pipelining respective odd and even row outputs on the output bus 326. Pipelining is used to ease the stress placed on the differential gain amplifier. Without pipelining, the output of the differential gain amplifier would have to be sampled in the short resting time between rows of output data. With pipelining, the differential gain amplifier may sample one row of output data while a previous row of output data is being output from the semiconductor chip.

In particular, a third memory element 330, 334 stores each consecutive odd row signal sample via odd row switches OR11, OR21. A fourth memory element 332, 336 stores each consecutive even row signal sample via even row switches ER11, ER21. Bus output switches OC11, OC21 and EC11, EC21 respectively couple stored odd row signal samples and stored even row signal samples on memory elements 330, 334 and memory elements 332, 336 to the respective bus driver amplifier 338, 340. The memory elements may be implemented using any suitable type of signal storage element such as a passive capacitor, charged coupled device or floating gate cmos transistor.

FIG. 4 illustrates the timing relationship for the operation of the switches in FIG. 3. Odd rows (row 1) and even rows (row 2) are pipelined. That is, while the present row of photodiodes in the semiconductor array is being sampled, the prior row of previously sampled photodiodes in the semiconductor of array is being readout to the output bus, 326 in FIG. 3. Pipelining odd and even rows permits the use of the entire row readout time for sampling the next row in the semiconductor photodiode array. Roughly one-half of the row readout time is used to sample the APS pixel signal value while the other half of the row readout time is used to sample the APS reset signal value.

In operation, the timing pulse 412 activates switches A11 and A31 to access the APS pixel signal values from the APS cells in row 1 of the photodiode array. The APS pixel signal values for two columns on row 1 are stored in memory elements 302, 306 in the column buffers. The number of column buffers is equal to the number of columns in the photodiode array so that the APS pixel signal value for all columns on row 1 are simultaneously accessed. Row 1 is then reset (not shown). Thereafter, the timing pulse 416 activates switches A21 and A41 to access the APS reset signal values of row 1 in the photodiode array. The APS reset signal values for all columns on row 1 are simultaneously accessed. For the two column buffers shown in FIG. 3, the APS reset signal values for column 1 and column 2 are respectively stored in memory elements 304, 308 in the column buffers.

After the APS pixel signal values and the APS reset signal values for row 1 are stored, timing pulse 426 activates switches OR11 and OR21 which couples the output of the differential gain amplifiers 342 and 344 to the respective odd row memory storage elements 330 and 334. In such manner, corrected APS pixel signal values for all the photodiodes in row 1 are simultaneously stored in respective odd row memory elements 330, 334.

The process is repeated for row 2 (i.e., for the even rows). Timing pulse 414 activates switches A11 and A13 to access the APS pixel signal values from the APS cells in row 2 of the photodiode array. The APS pixel signal values for all of row 2 are stored in memory elements 302, 306 in the column buffers. Row 2 is then reset (not shown). Thereafter, the timing pulse 418 activates switches A21 and A41 to access the APS reset signal values of row 2 in the photodiode array. The APS reset signal values for all of row 2 are stored in memory elements 304, 308 in the column buffers.

After the APS pixel signal values and the APS reset signal values for row 2 are stored, timing pulse 430 activates switches ER11 and ER21 which couples the output of the differential gain amplifiers 342 and 344 to the respective even row memory storage elements 332 and 336. In such manner, corrected APS pixel signal values for all the photodiodes in row 2 are simultaneously stored in respective odd row memory elements 332, 336. Thus, one set of memory elements 330, 334 store corrected APS pixel signal values for odd rows while the other set of memory elements 332, 336 store corrected APS pixel signal values for even rows of the semiconductor photodiode array.

The corrected APS pixel signal values for alternate rows are sequentially readout to the output bus 326. In particular, timing pulse 454 activates switches OC11 and OC21 for readout of odd rows. During timing pulse 454, output data switches C11 and C21 are activated in sequence by timing pulses 434 and 436 respectively. Data from even rows is readout during timing pulse 456, which activates switches EC11 and EC21. During timing pulse 456, output data switches C11 and C21 are activated in sequence by timing pulses 442 and 444 respectively.

In FIG. 3, a separate column buffer is provided for each column, with each column buffer having one differential gain amplifier and one bus driver amplifier per column of the array. As a result, the space available for the column buffer may be limited because the column to column spacing is typically the same as the photodiode spacing in the semiconductor array.

Multiplexed Differential Gain Amplifier

A multiplexed and pipelined column buffer adapted to serve 4 columns is shown in FIG. 5. Four signal sample memory elements 502, 506, 510, 514 are provided for storing the APS pixel signal values for the 4 columns (columns 1–4). Four reset sample memory elements 504, 508, 512, 516 are provided for storing the APS reset signal values for the 4 columns. Switches A1–A8 are provided to couple the APS pixel signals and APS reset signals from 4 columns to the respective 4 signal sample memory elements 502, 506, 510, 514 and 4 reset sample memory elements 504, 508, 512, 516.

Two multiplexed differential gain amplifiers 534, 536 are provided to compute the corrected APS pixel signal value (as the difference between the respective stored APS pixel signal values and respective stored APS reset signal values). Switches B1–B8 couple signal sample memory elements 502, 506, 510, 514 and the reset sample memory elements 504, 508, 512, 516 to the multiplexed differential gain amplifiers 534, 536. One differential gain amplifier 534 serves column 1 and column 2. The other differential gain amplifier 536 serves column 3 and column 4.

Multiplexed Bus Driver

In addition, the bus driver amplifier 538 is also multiplexed. In particular, 4 odd row memory elements 518, 522, 526, 530 are provided to store corrected APS pixel signal values for odd rows of the photodiode array via switches OR1–OR4. Additional 4 even row memory elements 520, 524, 528, 532 are provided to store corrected APS pixel signal values for even rows of the photodiode array via switches ER1–ER4.

On the output side of the multiplexed column buffer, switches OC1–OC4 couple the corrected APS pixel signal values for the odd rows to a multiplexed bus driver 538 to the output bus 540 via output data switch 542 (C1). Switches EC1–EC4 couple the corrected APS pixel signal values for the even rows to the multiplexed bus driver 538 to the output bus 540 via output data switch 542. A single bus driver 538 serves 4 columns.

Multiplexing a single bus driver 538 among 4 columns facilitates obtaining higher data readout speeds. To increase the data readout speed, larger output data switches (i.e., output data switches C11 and C21 in prior art FIG. 3 or output data switch C1 in FIG. 5) are needed. Larger output data switches increase the output bus loading, which is primarily the sum of the junction capacitance of all the output data switches. Since the output data switch 542 (as well as the bus driver 538) is shared among 4 columns, fewer output data switches 542 are needed. Thus, as compared to the prior art, the size of the output data switch 542 may be increased so as to present 4 times the junction capacitance, yet the total imaging chip data output bus will have the same capacitance loading. Conversely, for the same data output bus capacitance loading, the output data switch 542 can be made smaller to present ¼ the junction capacitance. As a result, higher data readout rates are obtainable with reduced output bus loading.

FIG. 6 illustrates the timing relationship for the operation of the switches in FIG. 5. As before, odd rows (row 1) and even rows (row 2) are pipelined. The active amplifier elements 534, 536, 538 are multiplexed. In particular, differential gain amplifier 534 is multiplexed to compute the corrected APS pixel signal value for both column 1 and column 2. Differential gain amplifier 536 is multiplexed to compute the corrected APS pixel signal value for both column 3 and column 4.

With respect to the output bus drivers, bus driver amplifier 538 is multiplexed to output stored values for the corrected APS pixel signal values for all four columns 1 to 4. Multiplexing output bus drivers proportionally reduces the number of buffers connected to the output bus 540, which lowers the total capacitance of the bus. A lowered bus capacitance, in turn, increases the maximum attainable output data rate.

In operation, the timing pulse 612 activates switches A1, A3, A5 and A7 to sample the APS pixel signal values from the APS cells in row 1 of the photodiode array. The APS pixel signal values from row 1 are stored in memory elements 502, 506, 510, 514. Row 1 is then reset (not shown). Thereafter, the timing pulse 616 activates switches A2, A4, A6 and A8 to access the APS reset signal values of row 1 in the photodiode array. The APS reset signal values for row 1 are then stored in memory elements 504, 508, 512, and 516 in the multiplexed column buffer.

After the APS pixel signal values and the APS reset signal values for row 1 are stored, timing pulse 620 activates switches B1 and B2, which couples the stored APS pixel signal value and the stored APS reset signal value for column 1 to the differential amplifier 534. At the same time, timing pulse 620 activates switches B5 and B6, which couples the stored APS pixel signal value and the stored APS reset signal value for column 3 to the differential amplifier 536. The corrected APS signal values for columns 1 and 3 for row 1 are thus computed at the same time.

Timing pulse 624 activates switches B3 and B4, which couples the stored APS pixel signal value and the stored APS reset signal value for column 2 to the differential amplifier 534.

At the same time, timing pulse 624 activates switches B7 and B8 which couples the APS pixel signal value and the APS reset signal value for column 4 to the differential amplifier 536. The corrected APS signal values for columns 2 and 4 for row 1 are thus computed at the same time. However, the two differential gain amplifiers 534, 536 are multiplexed to compute the corrected APS signal values for four columns.

During timing pulse 620, timing pulse 626 activates switches OR1 and OR3, which stores the corrected APS signal values for columns 1 and 3 in memory elements 518 and 526. During timing pulse 624, timing pulse 628 activates switches OR2 and OR4, which stores the corrected APS signal values for columns 2 and 4 in memory elements 522 and 530. In such manner, corrected APS pixel signal values for all the photodiodes in row 1 are stored in respective odd row memory elements 518, 522, 526 and 530.

The process is repeated for row 2 (i.e., for the even rows). Timing pulse 614 activates switches A1, A3, A5 and A7 to sample the APS pixel signal values from the APS cells in row 2 of the photodiode array. The APS pixel signal values from row 2 are stored in memory elements 502, 506, 510, 514. Row 2 is then reset (not shown). Thereafter, the timing pulse 618 activates switches A2, A4, A6 and A8 to access the APS reset signal values of row 2 in the photodiode array. The APS reset signal values for row 2 are then stored in memory elements 504, 508, 512, and 516 in the multiplexed column buffer.

After the APS pixel signal values and the APS reset signal values for row 2 are stored, timing pulse 622 activates switches B1 and B2, which couples the stored APS pixel signal value and the stored APS reset signal value for column 1 to the differential amplifier 534.

At the same time, timing pulse 622 activates switches B5 and B6, which couples the stored APS pixel signal value and the stored APS reset signal value for column 3 to the differential amplifier 536. The corrected APS signal values for columns 1 and 3 for row 2 are thus computed.

Timing pulse 625 activates switches B3 and B4, which couples the stored APS pixel signal value and the stored APS reset signal value for column 2 to the differential amplifier 534. At the same time, timing pulse 625 activates switches B7 and B8 which couples the stored APS pixel signal value and the stored APS reset signal value for column 4 to the differential amplifier 536. The corrected APS signal values for columns 2 and 4 for row 2 are thus computed.

During timing pulse 622, timing pulse 630 activates switches ER1 and ER3, which stores the corrected APS signal values for columns 1 and 3 in memory elements 520 and 528. During timing pulse 625, timing pulse 632 activates switches ER2 and ER4, which stores the corrected APS signal values for columns 2 and 4 in memory elements 524 and 532. In such manner, corrected APS pixel signal values for all the photodiodes in row 2 are stored in respective even row memory elements 520, 524, 528 and 532. One set of memory elements 518, 522, 526, 530 store corrected APS pixel signal values for odd rows while the other set of memory elements 520, 524, 528, 532 store corrected APS pixel signal values for even rows of the semiconductor photodiode array.

The corrected APS pixel signal values for alternate rows are sequentially readout to the output bus 540. To readout one output line of data from columns 1 to 4, switches OC1, OC2, OC3 and OC4 are activated in sequence by timing pulses 634, 636, 638 and 640 respectively. Timing pulse 650 activates switch C1 to connect the bus driver amplifier 538 to the output bus 540 via output switch 542. To readout the next output line of data from columns 1 to 4, switches EC1, EC2, EC3 and EC4 are activated in sequence by timing pulses 642, 644, 646 and 648 respectively. Timing pulse 652 activates switch C1 to connect the bus driver amplifier 538 to the output bus 540 via output switch 542.

Although the disclosed embodiment illustrates a multiplexed column buffer in which each differential gain amplifier is multiplexed among two columns, and each bus driver amplifier is multiplexed among four columns, other combinations of multiplexed amplifiers are possible. For example, in an alternate embodiment, each of two differential gain amplifiers may be multiplexed among three columns each (6 columns total) and the bus driver amplifier may be multiplexed among six columns. In the latter case, six columns will share a single multiplexed column buffer. The width available on the semiconductor chip array for each column buffer will then be 39.6 microns (assuming 3.3 micron features). Each column buffer will then contain two multiplexed differential gain amplifiers and the width available on the semiconductor chip array for each differential gain amplifier will be 19.8 microns. In such manner, one multiplexed column buffer serves six columns, permitting the column buffer to be laid out in a space six times as wide as compared to a non-multiplexed column buffer.

In addition, a multiplexed column buffer is operable without the pipelining of odd and even rows. In such case, only one memory element per column is required to store the corrected APS pixel signal value. However, without pipelining odd and even rows, the differential gain amplifiers would require more bandwidth as compared to the case with pipelining. In the alternative, the amount of dead time between readout of rows of output data can be increased to compensate for the lack of pipelining.

What is claimed is:

1. A semiconductor imaging chip comprising:
   an array of active pixel sensors arranged in rows and columns, each of said active pixels sensors having a respective active pixel sensor signal value and an active pixel sensor reset value;
   an output terminal; and
   a plurality of multiplexed column buffers, each of said plurality of multiplexed column buffers having a respective first plurality of input terminals coupled to a respective first plurality of said columns, a first of said plurality of multiplexed column buffers comprising:
   first, second, third and fourth memory elements;
   said first memory element adapted to store an active pixel sensor signal value for a first column of said array;
   said second memory element adapted to store an active pixel sensor reset value for said first column of said array;
   said third memory element adapted to store an active pixel sensor signal value for a second column of said array;
   said fourth memory element adapted to and an active pixel sensor reset value for said second column of said array;
   a differential gain amplifier having respective first and second input terminals and a respective output terminal;
   said first input terminal of said differential gain amplifier being selectively coupled to one of said first and third memory elements;
   said second input terminal of said differential gain amplifier being selectively coupled to one of said second and fourth memory elements; and
   the output terminal of said differential gain amplifier being selectively coupled to said output terminal of said semiconductor imaging chip, wherein each of said plurality of multiplexed column buffers further comprises:
   a multiplexed bus driver amplifier having respective input and output terminals;
   fifth and sixth memory elements;
   said fifth memory element being selectively coupled to said output terminal of said differential gain amplifier to store a corrected APS pixel signal value output for said first column of said array;
   said sixth memory element being selectively coupled to said output terminal of said differential gain amplifier to store a corrected APS pixel signal value output for said second column of said array;
   said input terminal of said multiplexed bus driver amplifier being sequentially coupled to said fifth memory and said sixth memory clement so as to sequentially output a corrected APS pixel signal value for said first column of said array followed by a corrected APS pixel signal value for said second column of said array.

2. A multiplexed column buffer for use in a semiconductor imaging chip including an array of active pixel sensors arranged in rows and columns, said semiconductor imaging chip having an output terminal, said multiplexed column buffer comprising:
   respective first, second, third, fourth, fifth, sixth, seventh, eighth, ninth, tenth, eleventh and twelfth switches;
   respective first, second, third, fourth, fifth and sixth memory elements;
   a differential gain amplifier having respective first and second input terminals and a respective output terminal;
   a bus driver amplifier having respective input and output terminals;
   said first switch coupling said first memory element to a first column of said array of active pixel sensors;
   said second switch coupling said second memory element to said first column of said array of active pixel sensors;
   said third switch coupling said third memory element to a second column of said array of active pixel sensors;
   said fourth switch coupling said fourth memory element to said second column of said array of active pixel sensors;
   said fifth switch coupling said first memory element to said first input terminal of said differential gain amplifier;
   said sixth switch coupling said third memory element to said first input terminal of said differential gain amplifier;
   said seventh switch coupling said second memory element to said second input terminal of said differential gain amplifier;
   said eighth switch coupling said fourth memory element to said second input terminal of said differential gain amplifier;
   said ninth switch coupling said fifth memory element to said output terminal of said differential gain amplifier;
   said tenth switch coupling said sixth memory element to said output terminal of said differential gain amplifier;
   said eleventh switch coupling said fifth memory element to said input terminal of said bus driver amplifier;
   said twelfth switch coupling said sixth memory element to said input terminal of said bus driver amplifier; and
   said output terminal of said bus driver amplifier being coupled to said output terminal of said semiconductor imaging chip.

* * * * *